(12) United States Patent
Nakamura et al.

(10) Patent No.: US 9,496,300 B2
(45) Date of Patent: Nov. 15, 2016

(54) IMAGING DEVICE HAVING ARRAY OF SPECTROSCOPIC SECTIONS WHEREIN AN INTERVAL BETWEEN TWO SPECTROSCOPIC SECTIONS AT A PERIPHERY OF AN IMAGING PLANE IS SMALLER THAN AN INTERVAL BETWEEN TWO SPECTROSCOPIC SECTIONS AT A CENTER OF THE IMAGING PLANE

(71) Applicant: Panasonic Corporation, Osaka (JP)

(72) Inventors: Tatsuya Nakamura, Osaka (JP); Seiji Nishiwaki, Hyogo (JP);
(Continued)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 352 days.

(21) Appl. No.: 14/008,750

(22) PCT Filed: Dec. 18, 2012

(86) PCT No.: PCT/JP2012/008066
§ 371 (c)(1),
(2) Date: Sep. 30, 2013

(87) PCT Pub. No.: WO2013/094178
PCT Pub. Date: Jun. 27, 2013

(65) Prior Publication Data
US 2014/0124650 A1    May 8, 2014

(30) Foreign Application Priority Data

Dec. 19, 2011    (JP) .................................. 2011-276969

(51) Int. Cl.
*H01J 5/16*        (2006.01)
*H01L 27/00*    (2006.01)
(Continued)

(52) U.S. Cl.
CPC ... *H01L 27/14625* (2013.01); *H01L 27/14629* (2013.01); *H01L 27/14645* (2013.01);
(Continued)

(58) Field of Classification Search
CPC .................... H01L 27/14625; H01L 27/14629; H01L 27/14645; H01L 27/14621;
(Continued)

(56) References Cited

U.S. PATENT DOCUMENTS 5,701,005 A     12/1997  Meyers
6,518,640 B2 *   2/2003  Suzuki .............. H01L 27/14601
                                                                257/229
(Continued)

FOREIGN PATENT DOCUMENTS

CN          102160180 A     8/2011
EP       0 750 207 A2    12/1996
(Continued)

OTHER PUBLICATIONS

International Search Report for corresponding International Application No. PCT/JP2012/008066 mailed Feb. 19, 2013.
(Continued)

*Primary Examiner* — Georgia Epps
*Assistant Examiner* — Jennifer Bennett
(74) *Attorney, Agent, or Firm* — Renner, Otto, Boisselle & Sklar, LLP

(57) ABSTRACT

The imaging device disclosed herein includes: a plurality of photodetection sections having a light-receiving face, the plurality of photodetection sections being disposed in a two-dimensional array along a first direction and along a second direction different from the first direction, such that the light-receiving faces of the plurality of photodetection sections constitute an imaging plane; a transparent layer; and a plurality of spectroscopic sections having a greater refrac-
(Continued)

tive index than the transparent layer and being disposed in a two-dimensional array in a plane of arrangement. Zeroth order diffracted light and ±first order diffracted light, derived from light transmitted through each spectroscopic section and a portion of the transparent layer neighboring the spectroscopic section, respectively enter distinct photodetection sections among the plurality of photodetection sections. An interval between two adjacent spectroscopic sections along a predetermined direction is smaller at the periphery than at the center of the imaging plane.

9 Claims, 10 Drawing Sheets

(72) Inventors: Shinichi Wakabayashi, Osaka (JP); Masaaki Suzuki, Osaka (JP)

(51) Int. Cl.
*H01L 27/146* (2006.01)
*H04N 9/097* (2006.01)
*H01L 31/0232* (2014.01)
*H04N 9/04* (2006.01)

(52) U.S. Cl.
CPC .......... *H01L 31/0232* (2013.01); *H04N 9/097* (2013.01); *H04N 9/045* (2013.01)

(58) Field of Classification Search
CPC ................ H01L 31/0232; H04N 9/045; H04N 5/332; H04N 9/07; H04N 9/097; G01J 3/51

USPC .............. 250/208.1, 226, 216, 237 G, 227.2, 250/227.23; 257/432, 440, 443; 348/336, 348/337, 340, 272, 273, 280, 276
See application file for complete search history.

(56) References Cited

U.S. PATENT DOCUMENTS

| | | | |
|---|---|---|---|
| 8,274,123 B2* | 9/2012 | Tanaka | G02B 3/0056 257/432 |
| 2005/0035377 A1* | 2/2005 | Kamimura | H01L 27/14627 257/231 |
| 2006/0027732 A1* | 2/2006 | Ahn | H01L 27/14603 250/208.1 |
| 2010/0176473 A1 | 7/2010 | Nishiwaki | |
| 2011/0007179 A1 | 1/2011 | Hiramoto et al. | |
| 2011/0037869 A1* | 2/2011 | Hiramoto | G02B 5/045 348/222.1 |
| 2011/0164156 A1 | 7/2011 | Hiramoto et al. | |

FOREIGN PATENT DOCUMENTS

| | | |
|---|---|---|
| JP | 06-140609 A | 5/1994 |
| JP | 2003-018476 A | 1/2003 |
| JP | 2005-311693 A | 11/2005 |
| WO | WO 2009/019818 A1 | 2/2009 |
| WO | WO 2010/082455 A1 | 7/2010 |

OTHER PUBLICATIONS

Form PCT/ISA/237 for corresponding International Application No. PCT/JP2012/008066 dated Feb. 19, 2013 and partial English translation.
Search Report for corresponding Chinese Application No. 201280015736.5 dated Jun. 1, 2016 and its English translation.

* cited by examiner (a)  (b)

IMAGING DEVICE HAVING ARRAY OF SPECTROSCOPIC SECTIONS WHEREIN AN INTERVAL BETWEEN TWO SPECTROSCOPIC SECTIONS AT A PERIPHERY OF AN IMAGING PLANE IS SMALLER THAN AN INTERVAL BETWEEN TWO SPECTROSCOPIC SECTIONS AT A CENTER OF THE IMAGING PLANE

TECHNICAL FIELD

The present application relates to an imaging device, and more particularly to an imaging device which is capable of color separation and detection.

BACKGROUND ART

In recent years, with the increasing pixels in digital cameras and digital camcorders, CCD structures and CMOS structures are becoming smaller in their cell size. However, when the cell size becomes minutely small, the reduced geometric area in which light is received leads to a decrease in the amount of light received by each pixel, which is a problem.

Patent Document 1 discloses an imaging device which uses, instead of color filters, spectroscopic sections that achieve color separation of light through diffraction, thus enhancing the efficiency of light utility and obtaining a color image. Patent Document 2 discloses a signal processing method which detects incident light via color separation using spectroscopic sections such as those indicated in Patent Document 1, thus obtaining a color image. By realizing such an imaging device, presumably a higher efficiency of light utility than that provided by conventional imaging devices using color filters is obtained. In the present specification, a color image is meant as an image whose color tone is expressed in two or more colors.

CITATION LIST

Patent Literature

[Patent Document 1] International Publication No. 2009/019818
[Patent Document 2] International Publication No. 2010/082455

SUMMARY OF INVENTION

Technical Problem

However, in the aforementioned conventional techniques, a further improvement in image quality was desired. One non-limiting and exemplary embodiment of the present application provides an imaging device which allows a better image quality to be obtained than conventionally, the imaging device achieving color separation of light through diffraction.

SOLUTION TO PROBLEM

An imaging device according to one implementation of the present invention comprises: a plurality of photodetection sections having a light-receiving face, the plurality of photodetection sections being disposed in a two-dimensional array along a first direction and along a second direction different from the first direction, the light-receiving faces of the plurality of photodetection sections constituting an imaging plane; a transparent layer having an incident face and an outgoing face and being disposed so that the outgoing face opposes the imaging plane; and a plurality of spectroscopic sections having a greater refractive index than a refractive index of the transparent layer and being disposed in a two-dimensional array in a plane of arrangement, the plane of arrangement being within the transparent layer and parallel to the imaging plane, wherein, zeroth order diffracted light and ±first order diffracted light, derived from light transmitted through each spectroscopic section and a portion of the transparent layer neighboring the spectroscopic section, respectively enter distinct photodetection sections among the plurality of photodetection sections; and an interval between two adjacent spectroscopic sections along a predetermined direction is smaller at a periphery than at a center of the imaging plane.

ADVANTAGEOUS EFFECTS OF INVENTION

In an imaging device according to one implementation of the present invention, an interval between two adjacent spectroscopic sections along a predetermined direction is smaller at the periphery than at the center of the imaging plane. Therefore even if light is obliquely incident at the periphery of the imaging plane, diffracted light occurring from the spectroscopic sections is allowed to efficiently enter the desired photodetection sections. Therefore, color unevenness and luminance unevenness in the captured image can be suppressed.

DESCRIPTION OF EMBODIMENTS

The inventors have specifically studied the imaging devices which are used in the spectroscopic sections disclosed in Patent Documents 1 and 2, etc., to find that, when a target object is imaged with such imaging devices, color unevenness and luminance unevenness (color shading, luminance shading) are observed in the peripheral portion of the captured image. It was also found that such color unevenness and luminance unevenness are caused by the different incident angles of rays entering the imaging device.

Figure 1:
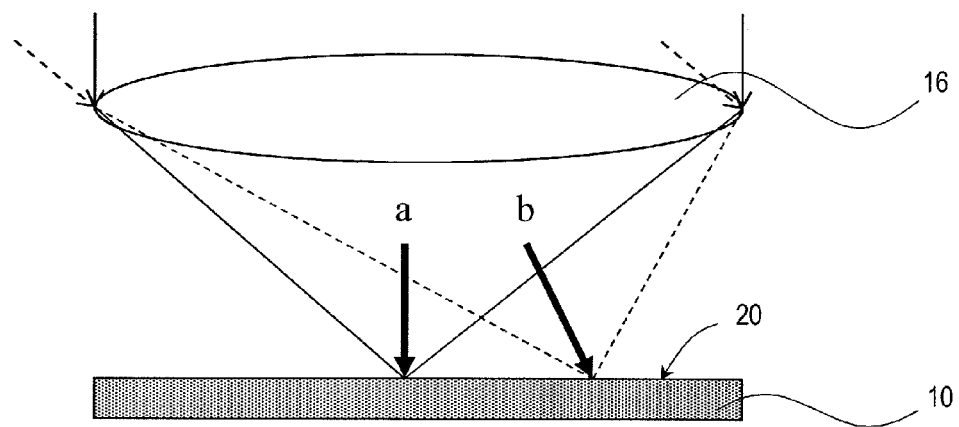
FIG. 1 A schematic diagram showing angles of light incident on an imaging plane in an imaging device with a generic structure.

FIG. 1 schematically shows rays entering an imaging plane 20, where an image of a target object which is converged with a lens 16 is captured by an imaging element 10. The lens 16 is representative of an imaging optical system which is object-side non-telecentric. As shown in FIG. 1, light a which enters the central portion of the imaging plane 20 has an essentially perpendicular angle with respect to the imaging plane 20. On the other hand, light b which enters the peripheral portion of the imaging plane 20 is incident on the imaging plane 20 at an angle which is inclined from a perpendicular direction to the imaging plane 20.

In the case of a conventional imaging device having color filters disposed on the surface of the imaging plane 20, such differences in incident angle do not present particular problems in terms of color unevenness. The reason is that, although light vignetting associated with some light shielding portion may occur and reduce the amount of light entering the photodetection sections as the incident angle increases, the wavelength characteristics of light transmitted through any color filter will not depend on the incident angle of the light entering the color filter. Therefore, in conventional imaging devices in which color filters are used, hardly any color unevenness occurs due to differences in the incident angle of light entering the color filters.

However, in the case where spectroscopic sections that achieve color separation of light through diffraction are used instead of color filters, the diffraction angle of diffracted light changes with the incident angle of light entering each spectroscopic section. Therefore, as shown in FIG. 1, a different incident angle of light from that in the central portion exists in the peripheral portion of the imaging plane 20, thus changing the diffraction angle of diffracted light; as a result, changing amounts of diffracted light which has undergone spectroscopy and enters the photodetection sections of the photodetector cause color unevenness and luminance unevenness. Based on this finding, the inventors have arrived at a novel imaging device which achieves separation and detection of colors so that an image can be obtained with reduced color unevenness and luminance unevenness. Hereinafter, embodiments of the imaging device according to the present invention will be described in detail. One implementation of the present invention is summarized as follows.

An imaging device according to one implementation of the present invention comprises: a plurality of photodetection sections having a light-receiving face, the plurality of photodetection sections being disposed in a two-dimensional array along a first direction and along a second direction different from the first direction, such that the light-receiving faces of the plurality of photodetection sections constitute an imaging plane; a transparent layer having an incident face and an outgoing face and being disposed so that the outgoing face opposes the imaging plane; and a plurality of spectroscopic sections having a greater refractive index than a refractive index of the transparent layer and being disposed in a two-dimensional array in a plane of arrangement, the plane of arrangement being within the transparent layer and parallel to the imaging plane, wherein, zeroth order diffracted light and ±first order diffracted light, derived from light transmitted through each spectroscopic section and a portion of the transparent layer neighboring the spectroscopic section, respectively enter distinct photodetection sections among the plurality of photodetection sections; and an interval between two adjacent spectroscopic sections along a predetermined direction is smaller at a periphery than at a center of the imaging plane.

In the transparent layer, each of the plurality of spectroscopic sections may have a columnar shape or a plate-like shape longitudinal in a direction in which the incident face and the outgoing face oppose each other.

The plurality of spectroscopic sections may be disposed in a two-dimensional array along the first direction and along the second direction; and each spectroscopic section may have a greater thickness along the second direction than along the first direction.

An interval between two adjacent spectroscopic sections along the first direction may be smaller at the periphery than at the center of the imaging plane.

An interval between two adjacent spectroscopic sections along the second direction may be smaller at the periphery than at the center of the imaging plane.

An interval between two adjacent spectroscopic sections along a radial direction of a circle whose center is the center of the imaging plane may be smaller at the periphery than at the center of the imaging plane.

A ray entering through the incident face and being incident at the center of the light-receiving face of each photodetection section may pass closer to the photodetection section and away from a center of the spectroscopic section corresponding to the photodetection section, the center of the spectroscopic section being taken along a direction in which the incident face and the outgoing face oppose each other.

The plurality of spectroscopic sections may include a plurality of first type of spectroscopic sections and a plurality of second type of spectroscopic sections, the plurality of first type of spectroscopic sections and the plurality of second type of spectroscopic sections diffracting light of mutually different wavelength bands.

(first embodiment)

Figure 2:
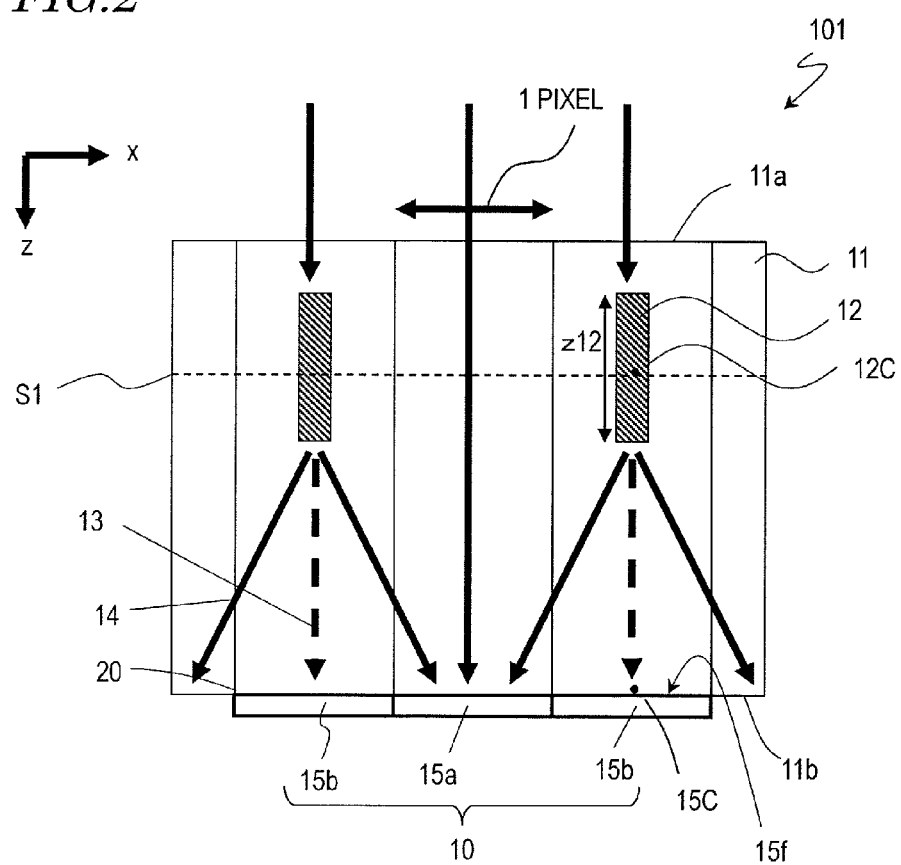
FIG. 2 A cross-sectional view showing a portion of a first embodiment of the imaging device according to the present invention.

Hereinafter, a first embodiment of the imaging device according to the present invention will be described. FIG. 2 shows a portion of schematic cross-sectional structure of the imaging device of the present embodiment. As shown in FIG. 2, the imaging device 101 includes an imaging element 10, a transparent layer 11, and a plurality of spectroscopic sections 12.

Figure 3:
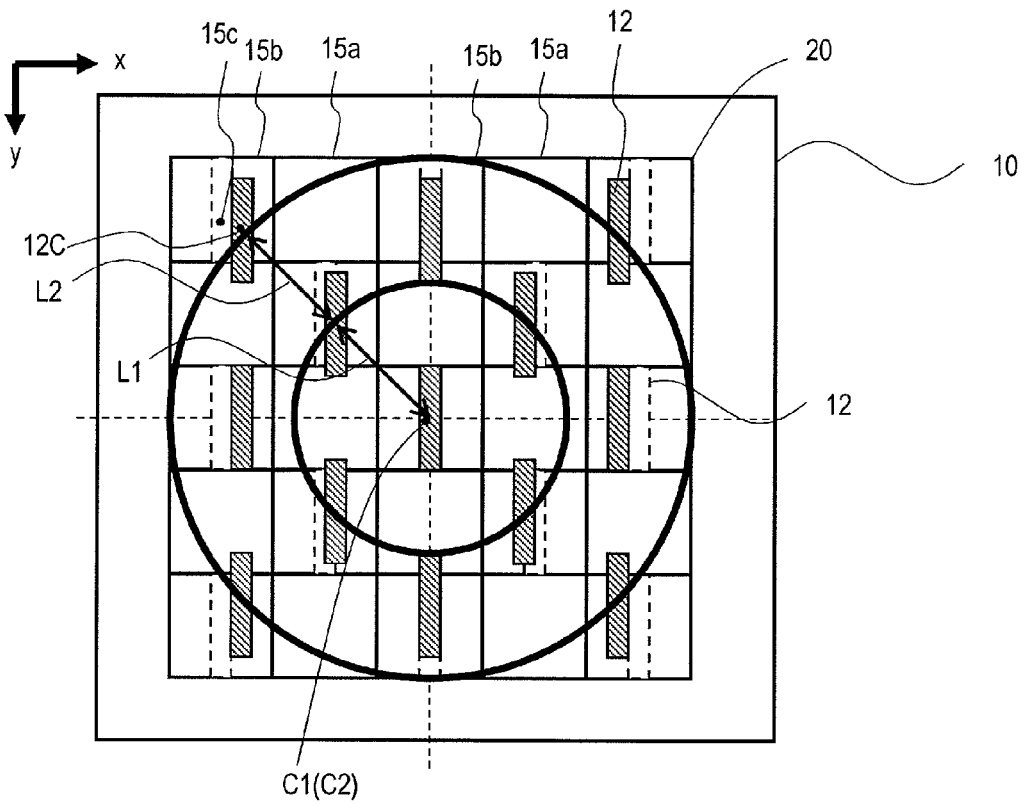
FIG. 3 A diagram showing an arrangement of photodetection sections and spectroscopic sections of the imaging device shown in FIG. 2.

The imaging element 10 includes a plurality of photodetection sections 15a and 15b having a light-receiving face 15f. Each of the photodetection sections 15a and 15b converts light which is radiated onto its light-receiving face 15f into an electrical signal for output. Since the plurality of photodetection sections 15a and 15b are placed in a two-dimensional array, the light-receiving faces 15f constitute an imaging plane 20 of the imaging element 10. FIG. 3 schematically shows an arrangement of the plurality of photodetection sections 15a and 15b on the imaging plane 20. In FIG. 3, the plurality of photodetection sections 15a and 15b are arranged along the x axis direction, which is a first direction, and along the y axis direction, which is a second direction different from the x axis direction. Although the first direction and the second direction are orthogonal to each other in the present embodiment, the first direction and the second direction may constitute any angle other than 90°. Although each light-receiving face 15f has a rectangular shape in the present embodiment, it may have hexagonal or other shapes.

The transparent layer 11 has an incident face 11a and an outgoing face 11b. The transparent layer 11 is disposed with respect to the imaging element 10 so that its outgoing face 11b opposes the imaging plane 20. Incident light from the object, scenery, etc., to be imaged enters through the incident face 11a, and is transmitted through the transparent layer 11 so as to exit from the outgoing face 11b. The outgoing light is incident on the imaging plane 20 of the imaging element 10. The transparent layer 11 may be transparent with respect to the incident light. For example, the transparent layer 11 may have optical characteristics such that it has no large absorption in the wavelength region of visible light, thus allowing visible light to be transmitted. On the incident face 11a of the transparent layer 11, a plurality of microlenses for converging purposes may be provided. Moreover, a microlens layer or a light guiding layer may be provided between the transparent layer 11 and the imaging plane 20.

The plurality of spectroscopic sections 12 are disposed within the transparent layer 11. Specifically, they take a two-dimensional array in a plane S1 of arrangement which is parallel to the imaging plane 20. FIG. 3 shows an arrangement of the plurality of spectroscopic sections 12 and the plurality of photodetection sections 15a and 15b on the imaging plane 20. As shown in FIG. 3, in the present embodiment, the plurality of spectroscopic sections 12 are disposed above every other photodetection sections 15b that exists in the x direction and the y direction, among the plurality of photodetection sections 15a and 15b arranged along the x direction and the y direction. On the imaging plane 20, the photodetection sections 15a and 15b constitute two distinct regions of a checker (checkerboard pattern). Specifically, each photodetection section 15a is sandwiched by a pair of photodetection sections 15b in the x direction and in the y direction, whereas each photodetection section 15b is sandwiched by a pair of photodetection sections 15a in the x direction and in the y direction.

Each of the plurality of spectroscopic sections 12 may be transparent with respect to the incident light. For example, the spectroscopic sections 12 may have optical characteristics such that they have no large absorption in the wavelength region of visible light, thus allowing visible light to be transmitted. Moreover, the plurality of spectroscopic sections 12 have a refractive index which is greater than the refractive index of the transparent layer 11. In other words, given the refractive indices n11 and n12 of the transparent layer 11 and the spectroscopic sections 12, the relationship n11<n12 is satisfied.

Figure 4:
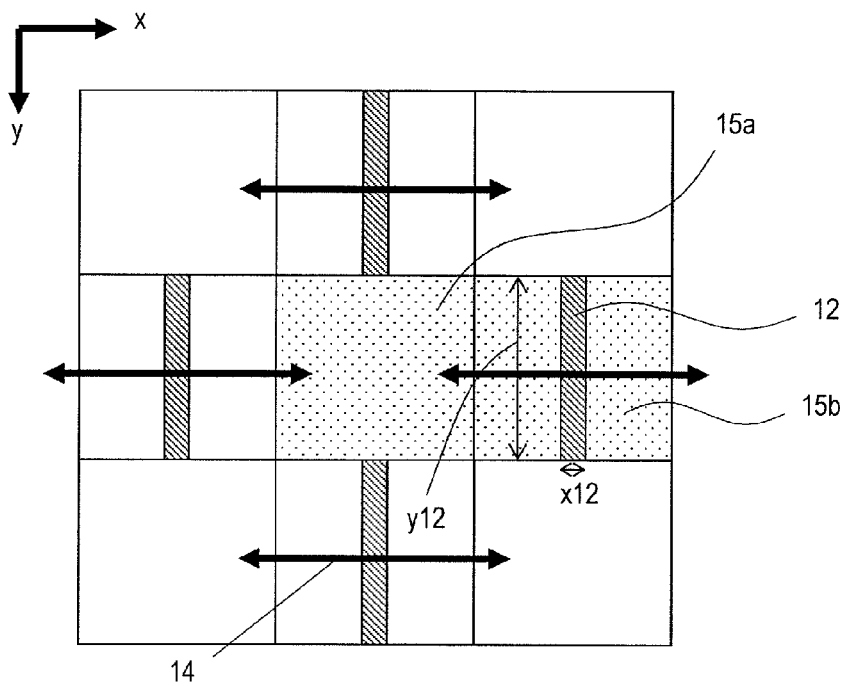
FIG. 4 An enlarged view of FIG. 3.

FIG. 4 shows enlarged a portion of the arrangement of spectroscopic sections 12 shown in FIG. 3. As shown in FIG. 4, for example, each spectroscopic section 12 has a thickness x12 and a thickness y12 along the x direction and the y direction, such that the thickness y12 along the y direction is greater than the thickness x12 along the x direction. Moreover, as shown in FIG. 2 and FIG. 4, each spectroscopic section 12 has a columnar shape or plate-like shape which is longitudinal in a z direction, the z direction being a direction in which the incident face 11a and the outgoing face 11b oppose each other. The length along the z direction is z12.

As shown in FIG. 2, light which enters at the incident face 11a of the transparent layer 11 travels toward the outgoing face 11b. At this time, an optical path difference h, which is expressed as z12(n12−n11), occurs between the light transmitted through a spectroscopic section 12 and the light transmitted through a portion of the transparent layer 11 neighboring the spectroscopic section 12. When this optical path difference h is a half-integer multiple (0.5, 1.5, . . . ) of the wavelength (wavelength: 700 nm) of red light, for example, ±first order diffracted light 14 of red is generated. When the incident light is white light, zeroth order diffracted light 13 of cyan, which is a complementary color of red, is generated.

Therefore, by appropriately setting the diffraction angle of the ±first order diffracted light 14 and the distance between each spectroscopic section 12 and each light-receiving face 15f, the zeroth order diffracted light 13 and the ±first order diffracted light 14 can be allowed to enter distinct photodetection sections 15a and 15b. Specifically, ±first order diffracted light 14 of red is allowed to enter the photodetection sections 15a, while zeroth order diffracted light of cyan is allowed to enter the photodetection sections 15b. Thus, by allowing light to be transmitted through the transparent layer 11 in which the spectroscopic sections 12 are embedded, it is possible to achieve color separation without using color filters. Therefore, a higher efficiency of light utility than that provided by conventional imaging devices using color filters can be obtained. As described above, according to the present embodiment, a subject can be imaged by separating red and cyan, for example, thus obtaining a color image whose color tone is expressed in red and cyan.

As shown in FIG. 4, when the spectroscopic sections 12 are disposed only above the photodetection sections 15b, each photodetection section 15a receives ±first order diffracted light 14 through the spectroscopic sections 12 that are located above both adjoining photodetection sections 15b on the x direction. Moreover, since the spectroscopic sections 12 are not disposed above the photodetection sections 15a, light entering the transparent layer 11, i.e., white light, is also incident on the photodetection sections 15a. On the other hand, the photodetection sections 15b mainly receive zeroth order diffracted light 13 which is generated by the spectroscopic sections 12. Therefore, for example, by processing electrical signals which are obtained with the imaging element 10 while treating the adjacent photodetection sections 15a and 15b as one pixel, grayscaled red and blue image signals can be obtained. The specific method of designing the shape of the spectroscopic sections 12 and the method of generating a multi-color image signal through signal processing are disclosed in Patent Document 1 and Patent Document 2.

The diffraction angle of the ±first order diffracted light 14 ascribable to the spectroscopic sections 12 varies depending on the incident angle of the incident light. Since the light which enters the peripheral portion of the imaging plane 20 is incident on the imaging plane 20 at an angle which is inclined from a perpendicular direction to the imaging plane 20, the diffraction angle of the ±first order diffracted light 14 also differs between the central portion and the peripheral portion of the imaging plane 20. Consequently, color unevenness and luminance unevenness occur at the peripheral portion of an image which is captured by the imaging element, as was described earlier. In order to solve this problem, in the imaging device 101 of the present embodiment, the arraying interval of the spectroscopic sections is differentiated between the central portion and the peripheral portion of the imaging plane 20. In FIG. 3, rectangles indicated by dotted lines represent the positions of the spectroscopic sections 12 of the case where the intervals between all spectroscopic sections 12 are equal in the imaging plane 20, whereas rectangles shown hatched represent the arrangement of the spectroscopic sections 12 in the imaging device 101 of the present embodiment. As shown in FIG. 3, in the imaging device 101 of the present embodiment, the interval between two adjacent spectroscopic sections along a predetermined direction is smaller at the periphery than at the center C1 of the imaging plane 20.

In the present embodiment, the interval between two adjacent spectroscopic sections 12 along the x direction is smaller at the periphery than at the center C1 of the imaging plane 20. Moreover, the interval between two adjacent spectroscopic sections along the y direction is smaller at the periphery than at the center C1 of the imaging plane 20. Therefore, along any radial direction of a circle whose center is a point C2 coinciding with the center C1 of the imaging plane 20, the interval between two adjacent spectroscopic sections 12 is smaller at the periphery than at the center C1 of the imaging plane 20 (L2<L1). Herein, the interval between two adjacent spectroscopic sections 12 is meant to be the distance between the centers of the two adjacent spectroscopic sections 12 along that direction.

In other words, when looking at the positions of the spectroscopic sections 12 upon the plane S1 of arrangement, the center 12C of any spectroscopic section 12 that is located at the periphery of the imaging plane 20 does not coincide with the center 15C of the light-receiving face 15f of the photodetection section 15b; rather, the center 12C of the spectroscopic section 12 is shifted from the center 15C of the light-receiving face 15f toward the point C2 on the plane S1 of arrangement corresponding to the center C1 of the imaging plane 20.

The arraying interval of the spectroscopic sections 12 may be made gradually shorter when going from the center C1 of the imaging plane 20 toward the peripheral portion, or a plurality of split regions may be defined so that any range containing a plurality of spectroscopic sections 12 arranged at the same arraying interval constitutes one region, each such region having a different arraying interval. Alternatively, the arraying interval of the plurality of spectroscopic sections 12 located near the center C1 of the imaging plane 20 may be equal to twice the arraying interval of the photodetection sections 15a and 15b, while the arraying interval is only reduced for a plurality of spectroscopic sections 12 located in the peripheral portion of the imaging plane 20. Although the present embodiment illustrates that it is along the x direction and along the y direction that the interval of the spectroscopic sections 12 is smaller at the periphery than at the center C1 of the imaging plane 20, this condition may be satisfied at least along the x direction, as is described below.

Hereinafter, the reason why color unevenness and luminance unevenness are reduced in the imaging device 101 of the present embodiment will be described. First, a color unevenness and a luminance unevenness which occur in the case where the arraying interval of the spectroscopic sections 12 is equal between the central portion and the peripheral portion of the imaging plane 20 will be discussed.

Figure 5:
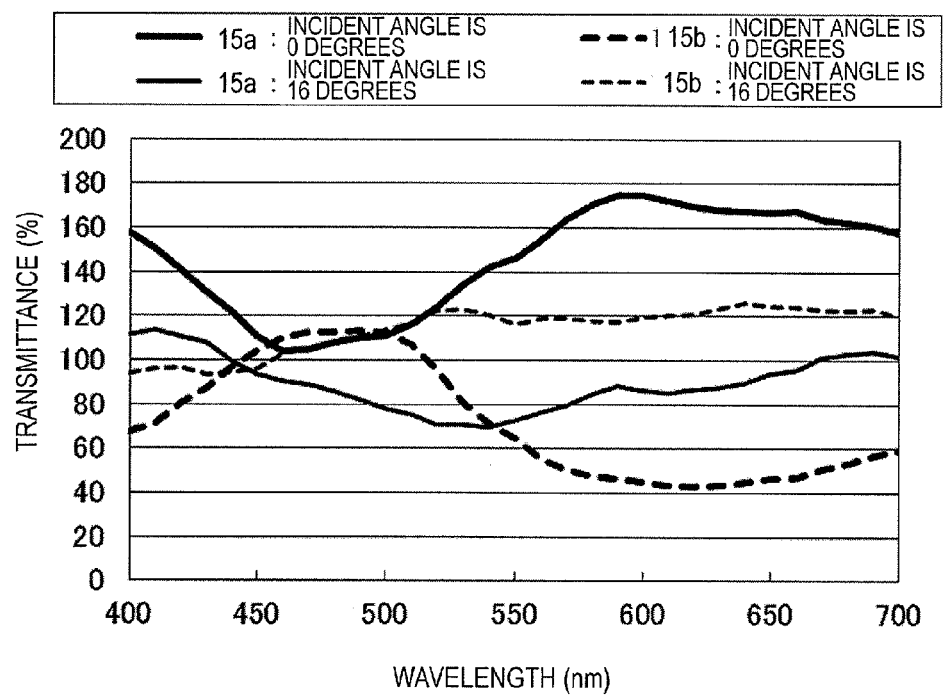
FIG. 5 A diagram showing spectroscopic characteristics, when light enters at angles of 0 degrees and 16 degrees in the x axis direction, of an imaging device in which the centers of light-receiving faces of photodetection sections coincide with the centers of spectroscopic sections.

FIG. 5 shows, in an arrangement where the centers 15C of the light-receiving faces of the photodetection sections 15b coincide with the centers 12C of the spectroscopic sections 12 on the plane S1 of arrangement as is illustrated in FIG. 2, spectroscopic characteristics when white light is allowed to enter at 0 degrees with respect to the normal of the incident face 11a (hereinafter referred to as perpendicular incidence), and spectroscopic characteristics when it is allowed to enter at an angle of 16 degrees in the x axis direction, assuming that the transparent layer 11 has a refractive index of 1.46 and that the spectroscopic sections 12 has a refractive index of 2.00. Transmittance on the vertical axis represents a value (%) which is normalized by the amount of light which enters one pixel in the case where no spectroscopic section 12 is provided. Under perpendicular incidence, transmittance increases at wavelengths of 600 nm to 700 nm (red wavelength band) in the light detected by the photodetection sections 15a, whereas transmittance decreases at wavelengths of 600 nm to 700 nm in the light detected by the photodetection sections 15b. Stated otherwise, it is indicated that red light is being separated by the spectroscopic sections 12.

On the other hand, when the incident angle is 16 degrees, the spectroscopic characteristics of the light detected by the photodetection sections 15a and 15b are greatly affected. That is, the increase in transmittance at wavelengths of 600 nm to 700 nm (red wavelength band) in the light detected by the photodetection sections 15a is reduced, and the decrease in transmittance at wavelengths of 600 nm to 700 nm in the light detected by the photodetection sections 15b is also reduced. In other words, red light separation is insufficient.

Figure 6:
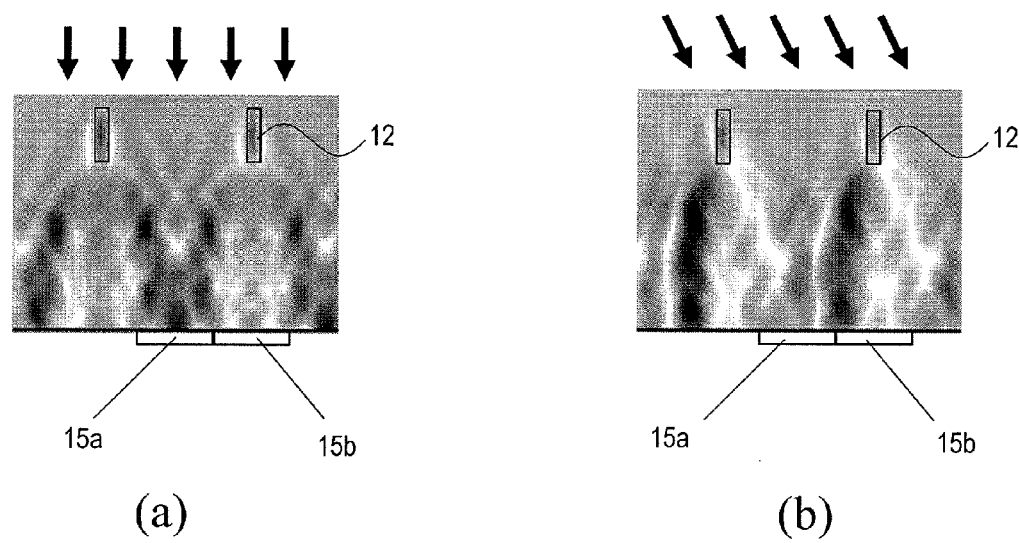
FIGS. 6 (a) and (b) are diagrams showing light intensity distributions when light with a wavelength of 650 nm enters at angles of 0 degrees and 16 degrees in the x axis direction, in an imaging device in which the centers of light-receiving faces of photodetection sections coincide with the centers of spectroscopic sections.

FIGS. 6(a) and (b) shows cross-sectional intensity distributions of light when light of 650 nm enters at 0 degrees and 16 degrees, respectively, in the aforementioned construction. In these figures, the regions which appear black represent large light amounts. As shown in FIG. 6(a), when the incident angle is 0 degrees, the ±first order diffracted light which is generated at the spectroscopic sections 12 efficiently enters the photodetection section 15a. On the other hand, when the incident angle is 16 degrees as shown in FIG. 6(b), the diffraction angle changes so that first order diffracted light also enters the photodetection sections 15b. This presumably causes the insufficient red light separation.

Figure 7:
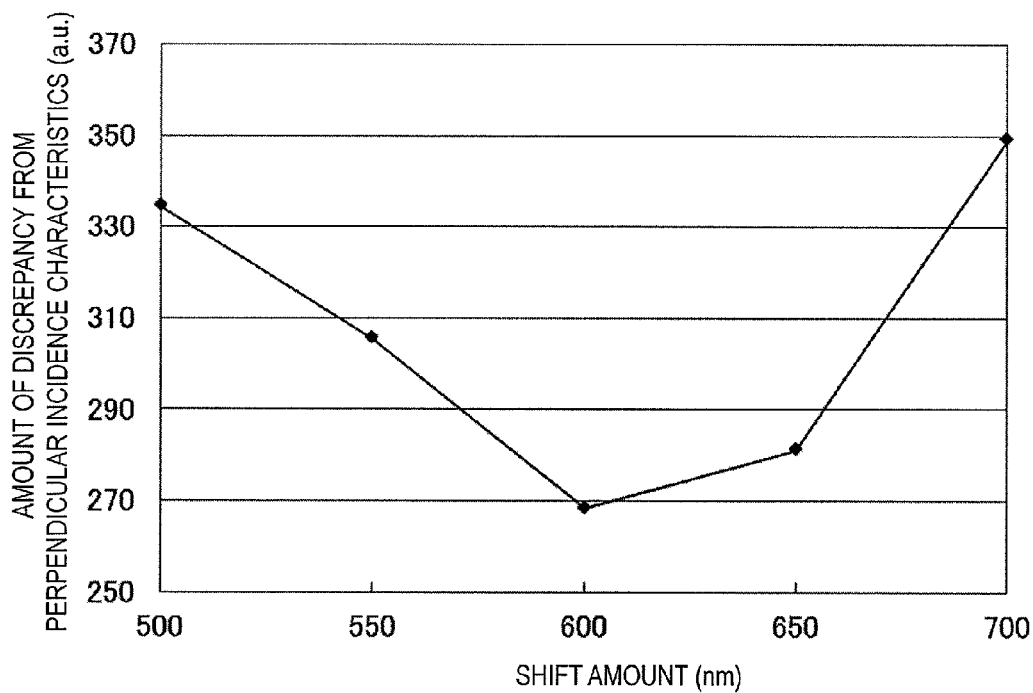
FIG. 7 A diagram showing a relationship between shift amounts of spectroscopic sections and amounts of discrepancy from characteristics under perpendicular incidence.

Next, results of shifting the positions of the spectroscopic sections 12 to ensure that the first order diffracted light from the spectroscopic sections 12 enters desired photodetection sections when light obliquely enters will be described. FIG. 7 shows a relationship between shift amounts in the positions of the spectroscopic sections 12 and detected light intensity, under an incident angle of 16 degrees. The horizontal axis represents amounts of position shift from the arrangement positions of the spectroscopic sections 12 under perpendicular incidence, whereas the vertical axis represents absolute values of differences in transmittance from the spectroscopic characteristics under perpendicular incidence. The positions of the spectroscopic sections 12 are shifted in the diffraction direction of light, i.e., toward the outgoing side of obliquely entering light, along the x direction in the arrangement of the spectroscopic sections 12 shown in FIG. 3.

It can be seen from FIG. 7 that, given an incident angle of 16 degrees, the amount of position shift is 600 nm when the difference from the spectroscopic characteristics under perpendicular incidence is smallest.

Figure 8:
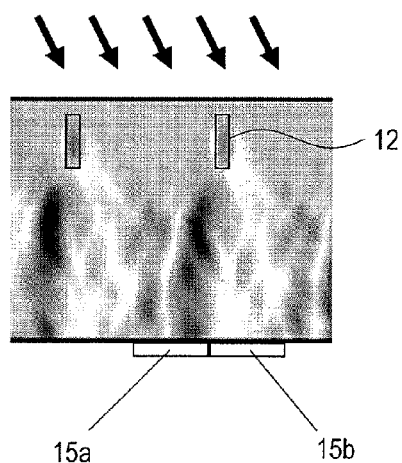
FIG. 8 A diagram showing a light intensity distribution when light with a wavelength of 650 nm enters at an angle of 16 degrees, where the spectroscopic sections are shifted to optimum positions.

FIG. 8 shows a cross-sectional intensity distribution of light when light with a wavelength of 650 nm is allowed to enter at an incident angle of 16 degrees, with the spectroscopic sections 12 being shifted by 600 nm. It can be seen that the first order diffracted light generated at the spectroscopic sections 12 is efficiently entering the photodetection section 15*a*.

Figure 9:
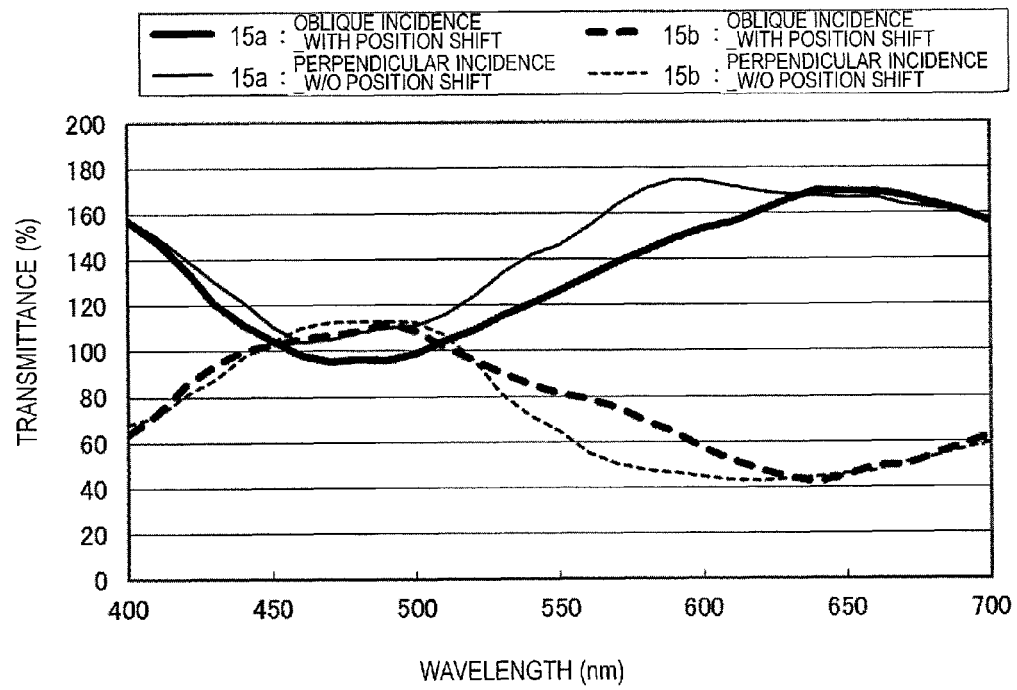
FIG. 9 A diagram showing spectroscopic characteristics when light enters at an angle of 16 degrees in the x axis direction, where the spectroscopic sections have an optimum shift in the x axis direction.

FIG. 9 shows spectroscopic characteristics when white light is allowed to enter at an incident angle of 16 degrees, where the amount of position shift of the spectroscopic sections 12 is 600 nm. Also shown for comparison are spectroscopic characteristics when white light is allowed to enter perpendicularly, where the amount of position shift is zero. In comparison with the results shown in FIG. 5, it can be seen that shifting the positions of the spectroscopic sections 12 allows light of the red region to be efficiently separated. It can also be seen that good matching is obtained with the spectroscopic characteristics of the case where white light is allowed to enter perpendicularly with zero amounts of position shift. These results indicate that, by shifting the positions of the spectroscopic sections 12 in the diffraction direction of light in accordance with the incident angle of light, changes in spectroscopic characteristics with respect to the incident angle can be suppressed, and color unevenness in the imaging region can be suppressed.

As shown in FIG. 3, when the thickness of the spectroscopic sections 12 along the y axis direction is greater than its thickness along the x axis direction, the first order diffracted light is diffracted in the x axis direction. Therefore, when light entering the spectroscopic sections 12 enters obliquely in the x axis direction, the diffraction angle of the ±first order diffracted light changes in the aforementioned manner. On the other hand, when light entering the spectroscopic sections 12 enters obliquely in the y axis direction, the diffraction angle of the ±first order diffracted light hardly changes. However, in this case, the outgoing direction of the ±first order diffracted light is shifted in the y axis direction, so that the ratio between the zeroth order diffracted light and the ±first order diffracted light in the light entering the photodetection sections 15*a* and 15*b* changes.

Figure 10:
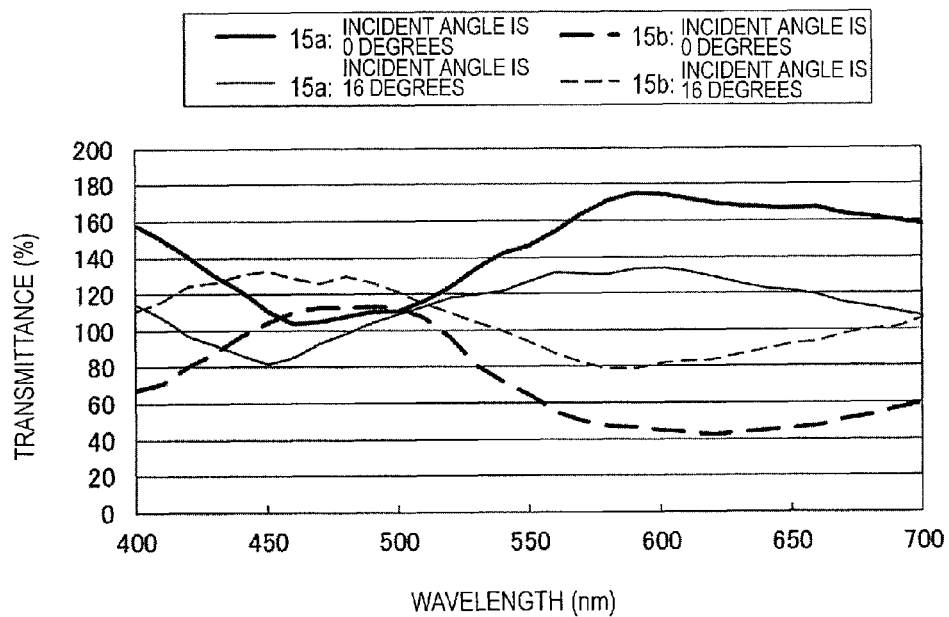
FIG. 10 A diagram showing spectroscopic characteristics, when light enters at angles of 0 degrees and 16 degrees in the y axis direction, of an imaging device in which the centers of light-receiving faces of photodetection sections coincide with the centers of spectroscopic sections.

FIG. 10 shows, in an arrangement where the centers 15C of the light-receiving faces of the photodetection sections 15*b* coincide with the centers of the spectroscopic sections 12 on the plane S1 of arrangement as is illustrated in FIG. 2, spectroscopic characteristics when white light is allowed to enter at 0 degrees with respect to the normal of the incident face 11*a* (hereinafter referred to as perpendicular incidence), and spectroscopic characteristics when it is allowed to enter at an angle of 16 degrees in the y axis direction. Similarly to FIG. 5, transmittance on the vertical axis represents a value (%) which is normalized by the amount of light which enters one pixel in the case where no spectroscopic section 12 is provided.

As shown in FIG. 10, the spectroscopic characteristics of the light entering the photodetection sections 15*a* are lower in overall intensity when the incident angle is 16 degrees than when it is 0 degrees. On the other hand, the spectroscopic characteristics of the light entering the photodetection sections 15*b* are larger in overall intensity when the incident angle is 16 degrees than when it is 0 degrees. This is presumably because the zeroth order diffracted light and ±first order diffracted light, which respectively would only enter the photodetection sections 15*a* and the photodetection sections 15*b* when the incident angle is 0 degrees, now also enter the photodetection sections 15*b* and the photodetection sections 15*a*.

Thus, even in the case where light enters obliquely in the y axis direction with respect to the normal of the imaging plane 20, the spectroscopic characteristics may change and cause color unevenness and luminance unevenness. Therefore, the spectroscopic sections 12 may also be shifted in the y axis direction, i.e., a direction perpendicular to the xz plane, which is a plane in which diffracted light exits.

When FIG. 5 showing changes in spectral transmittance characteristics of the case where light enters obliquely in the x axis direction is compared against FIG. 10 showing changes in the spectral transmittance characteristics of the case where light enters obliquely in the y axis direction, it can be seen that greater changes are occurring in FIG. 5. In other words, as described earlier, changes in the spectral transmittance characteristics from those under perpendicular incidence are affected to a greater extent when light obliquely enters in the direction in which the diffraction angle of the ±first order diffracted light changes. As will be indicated by FIG. 12 discussed later, this tendency becomes more pronounced as the incident angle increases. Thus, the effect of suppressing color unevenness and luminance unevenness can be obtained by making the interval of the spectroscopic sections 12 smaller at the periphery than at the center C1 of the imaging plane 20 at least along the x axis direction.

Figure 11:
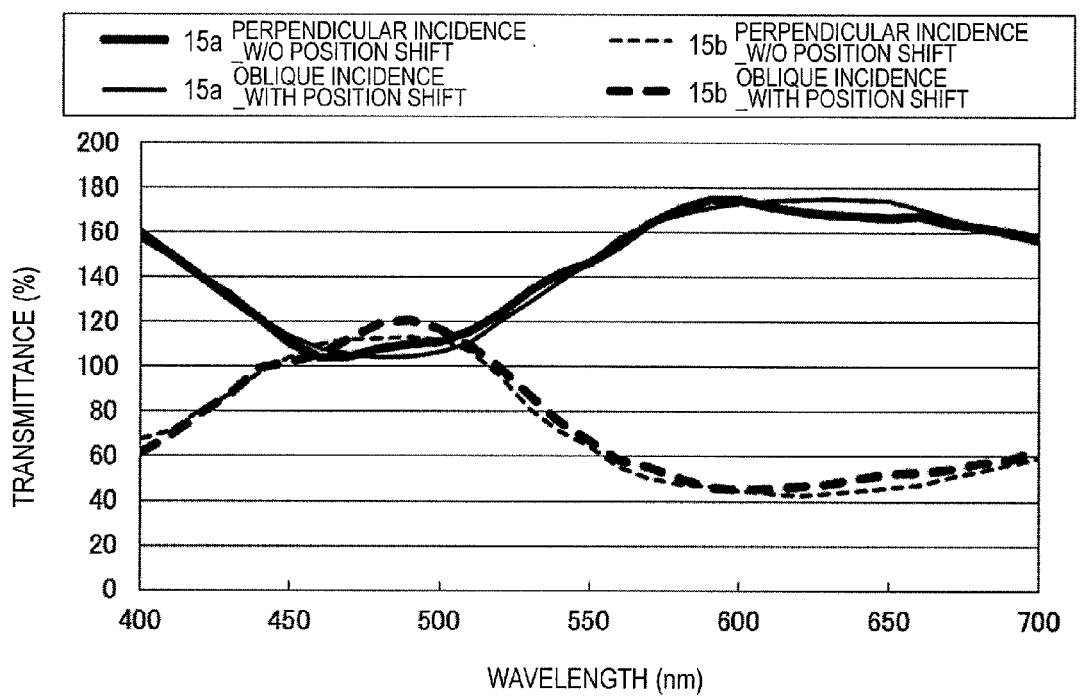
FIG. 11 A diagram showing spectroscopic characteristics when light enters at an angle of 16 degrees in the y axis direction, where the spectroscopic sections have an optimum shift in the y axis direction.
Figure 12:
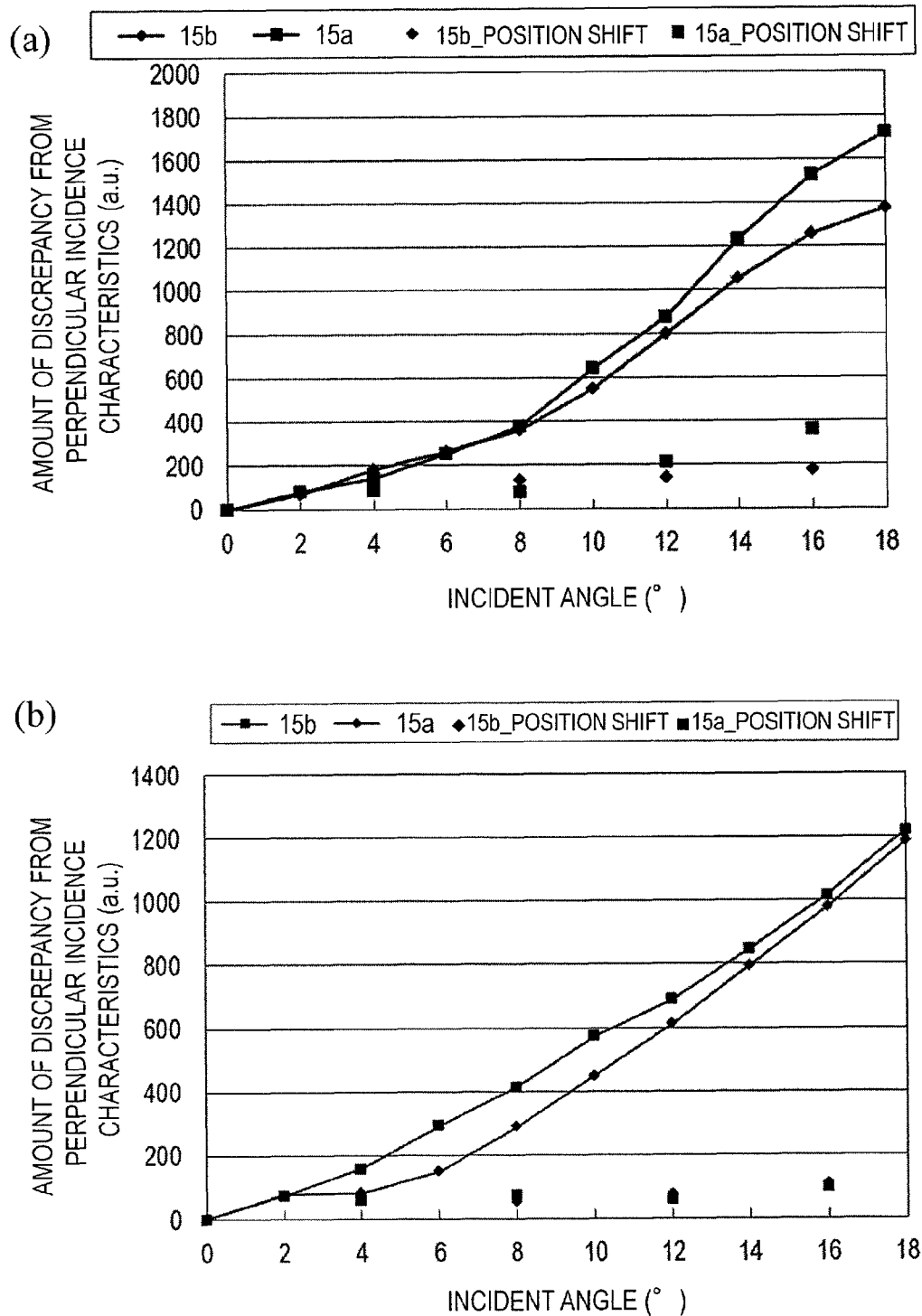
FIGS. 12 (a) and (b) are diagrams showing relationships between shift amounts of spectroscopic sections in the x axis direction and the y axis direction and amounts of discrepancy from perpendicular incidence characteristics.

FIG. 11 shows spectroscopic characteristics when, as a result of shifting the spectroscopic sections 12 in position in the y direction in the direction in which light enters, the positions of the spectroscopic sections 12 are shifted with an optimum shift amount that best matches the spectroscopic characteristics under perpendicular incidence. As the shift amount, a value is selected such that the absolute value of a difference in transmittance from the spectroscopic characteristics under perpendicular incidence becomes smallest. It has been found that, when the incident angle is 16 degrees, the amount of position shift that allows the spectroscopic characteristics to best match the spectroscopic characteristics under perpendicular incidence is 650 nm. As shown in FIG. 12, in both of the photodetection sections 15*a* and the photodetection sections 15*b*, the spectroscopic characteristics are well matched in waveform and transmittance.

With respect to light entering the photodetection sections 15*a* and the photodetection sections 15*b*, FIG. 12(*a*) shows a relationship between incident angles in the x axis direction and the absolute values of differences from the spectroscopic characteristics under perpendicular incidence, in the case where the spectroscopic sections 12 are shifted in position with optimum amounts and in the case where they are not shifted in position. With respect to light entering the photodetection sections 15*a* and the photodetection sections 15*b*, FIG. 12(*b*) shows a relationship between incident angles in the y axis direction and the absolute values of differences from the spectroscopic characteristics under perpendicular incidence, in the case where the spectroscopic sections 12 are shifted in position with optimum amounts and in the case where they are not shifted in position.

In both of the x axis direction and the y axis direction, when the positions of the spectroscopic sections 12 are not shifted, the discrepancy in spectroscopic characteristics increases as the incident angle increases. On the other hand, by shifting the positions of the spectroscopic sections 12, it becomes possible to reduce the amount of discrepancy to a certain value or less. This indicates that, even if the incident angle of incident light becomes larger when going from the center of the imaging plane toward the peripheral portion, shifting the positions of the spectroscopic sections allows the discrepancy in spectroscopic characteristics to be reduced to a certain value or less, thus suppressing the color unevenness and luminance unevenness in the peripheral portion of the captured image.

Figure 13:
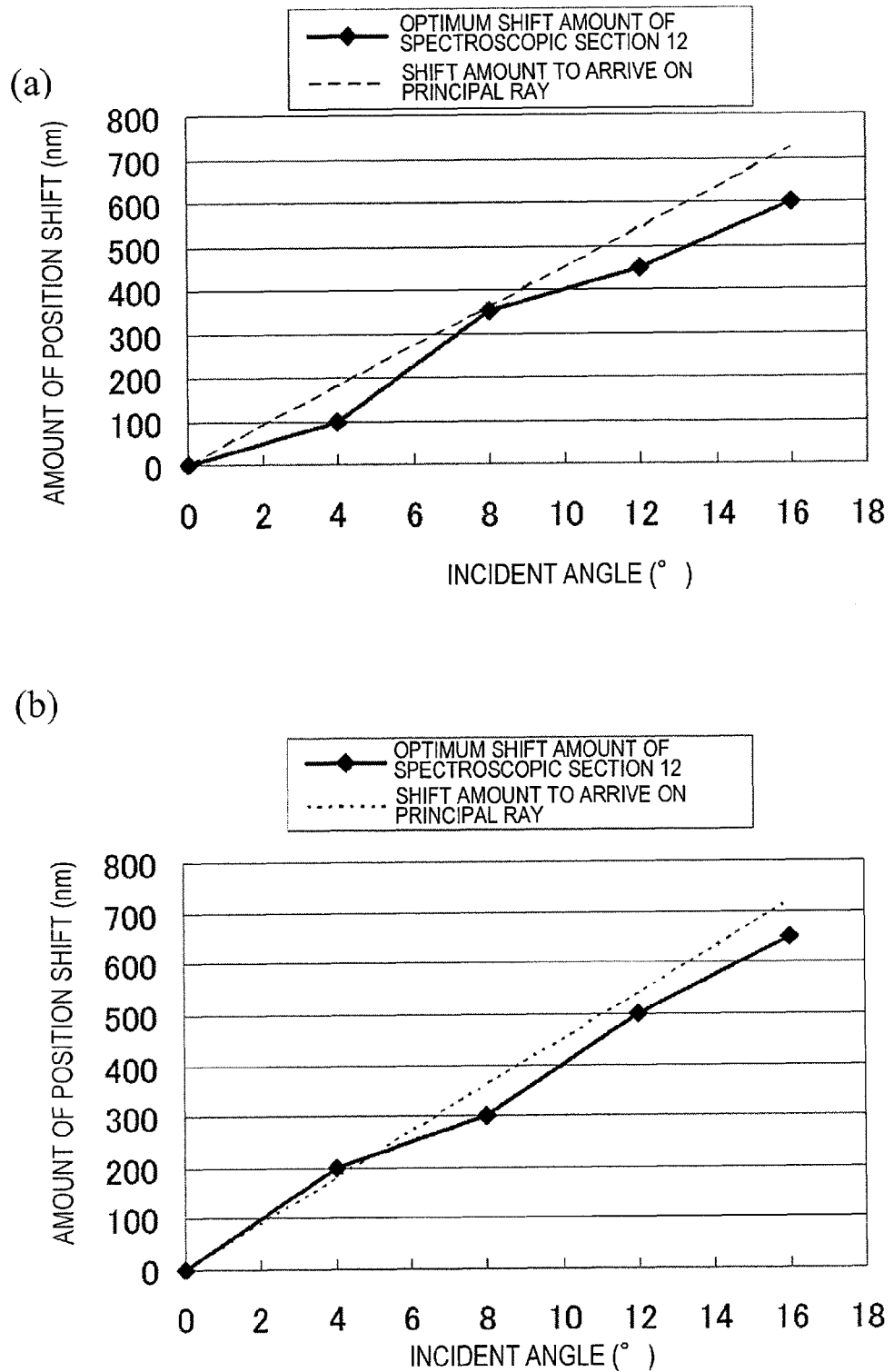
FIGS. 13 (a) and (b) are diagrams showing a relationship between incident angles in the x axis direction and the y axis direction and optimum shift amounts of spectroscopic sections, in the imaging device of the first embodiment.

FIG. 13(a) shows a relationship between incident angles in the x axis direction of light entering the imaging device and amounts of position shift of the spectroscopic sections that allow the spectroscopic characteristics at such incident angles to best match the spectroscopic characteristics under perpendicular incidence. FIG. 13(b) shows a relationship between incident angles in the y axis direction of light entering the imaging device and amounts of position shift of the spectroscopic sections that allow the spectroscopic characteristics at such incident angles to best match the spectroscopic characteristics under perpendicular incidence.

Figure 14:
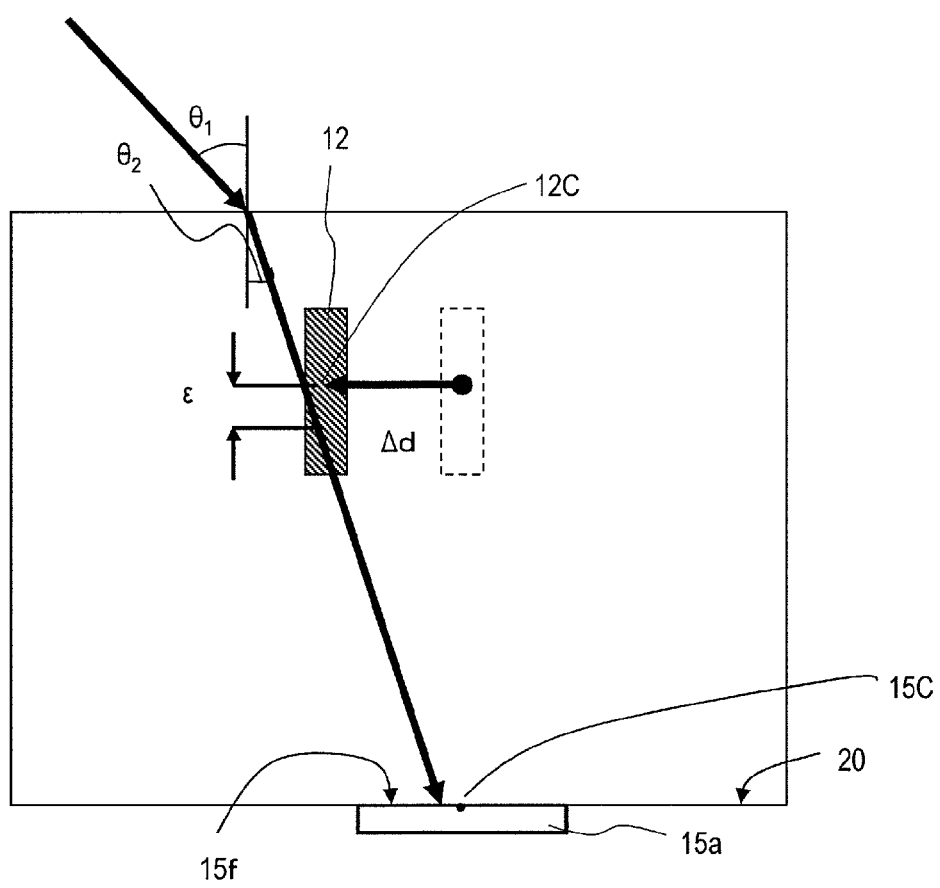
FIG. 14 A diagram showing relative positioning between a spectroscopic section and a principal ray when a spectroscopic section is shifted to an optimum position in the first embodiment.

As shown in FIG. 14, the amount of position shift is defined by a distance Δd of shift, in parallel to the imaging plane 20, from the center in the case where the center of the spectroscopic section 12 coincides with the center 15C of the light-receiving face 15f of the photodetection section 15a.

Moreover, a shift amount to arrive on the principal ray is defined by an amount of shift in a parallel direction to the imaging plane 20 which is made so that the center 12C of the spectroscopic section coincides with a single ray that is incident on the center 15C of the photodetection section in FIG. 14.

As shown in FIGS. 13(a) and (b), it can be seen that color unevenness and luminance unevenness can be suppressed by increasing the amount of position shift of each spectroscopic section in accordance with the incident angle. Therefore, in order to suppress color unevenness and luminance unevenness most efficiently, the interval of the spectroscopic sections 12 may decrease in the x direction and the y direction when going from the center of the imaging plane toward the peripheral portion.

Moreover, as shown in FIG. 14, when a spectroscopic section 12 is shifted to the optimum position, the principal ray which intersects the center 15C of the light-receiving face 15f of a photodetection section 15a travels through a position (ε in the figure) about 500 nm below the center 12C of the spectroscopic section 12. The spectroscopic section 12 has its longitudinal direction in the normal direction of the imaging plane 20, and spectroscopic section 12 has a greater refractive index than the refractive index of the transparent layer 11. Therefore, in the x axis direction, the path of the principal ray changes according to the principle of wave-guiding by the spectroscopic sections 12. Moreover, in the y axis direction, the path of the principal ray changes through refraction by the high-refractive index spectroscopic section 12. Thus, it is considered that the principal ray which intersects the center 15C of the light-receiving face 15f does not travel through the center 12C of the spectroscopic section 12, but passes closer to the photodetection section 15a and away from the center 12C.

Note that Japanese Laid-Open Patent Publication No. 2003-18476 discloses a design where, given a ray in a color filter that enters an imaging device from the exit pupil of a lens, the center position of the color filter is located upon or near the ray, this being in order to efficiently enhance the amount of light entering each pixel. As described above, in the imaging device 101 of the present embodiment, the principal ray which intersects the center 15C of the light-receiving face 15f may pass closer to the photodetection sections 15a and away from the center 12C, without traveling through the center 12C of the spectroscopic section 12. Thus, the arrangement of the spectroscopic sections 12 in the imaging device of the present embodiment is based on an entirely distinct technological reason from the arrangement of the color filters disclosed in Japanese Laid-Open Patent Publication No. 2003-18476, and provides a distinct effect therefrom.

Although the present embodiment illustrates that the spectroscopic sections 12 are provided for every other one of the plurality of photodetection sections 15 that are arranged along the x direction and the y direction, they may instead be provided above all photodetection sections 15.

(second embodiment)

Figure 15:
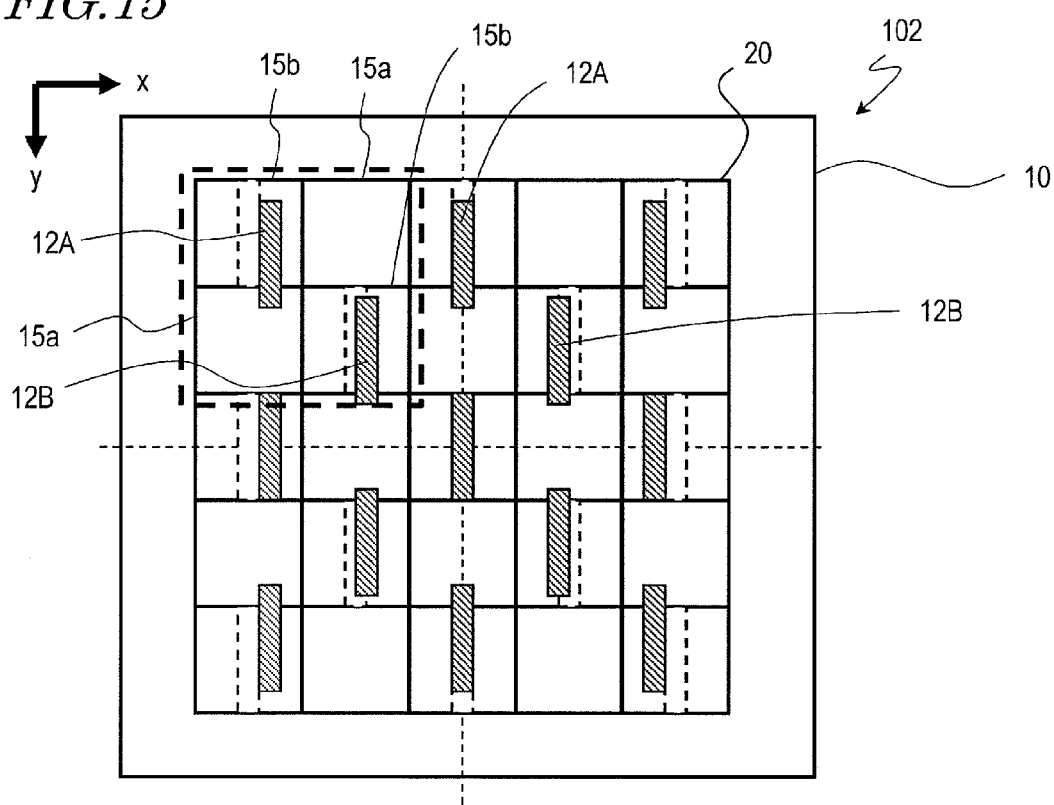
FIG. 15 A diagram showing an arrangement of photodetection sections and spectroscopic sections in a second embodiment of the imaging device according to the present invention.

Hereinafter, a second embodiment of the imaging device according to the present invention will be described. FIG. 15 shows an arrangement of photodetection sections and spectroscopic sections in the imaging device 102 of the present embodiment. The imaging device 102 is able to separately detect four colors. Therefore, the imaging device 102 includes an imaging element 10, a transparent layer 11, and a plurality of spectroscopic sections 12A and 12B.

The imaging device 102 differs from the imaging device 101 of the first embodiment in that it includes two types of spectroscopic sections 12A and spectroscopic sections 12B which diffract light of mutually different wavelength bands, in order to separately detect four colors. The other component elements are similar to those of the imaging device 101 of the first embodiment, and therefore the spectroscopic sections 12A and spectroscopic sections 12B will be specifically described below.

As shown in FIG. 15, similarly to the first embodiment, the spectroscopic sections 12A are designed so as to diffract light of the red wavelength band, for example. Moreover, the spectroscopic sections 12B are designed so as to diffract light in the blue wavelength band. As shown in FIG. 15, the spectroscopic sections 12A are disposed above the photodetection sections 15b, and the spectroscopic sections 12B are disposed above the photodetection sections 15a.

In order for the spectroscopic sections 12A and spectroscopic sections 12B to diffract light of mutually different wavelength bands, an optical path difference h between the light transmitted through a spectroscopic section 12A and light transmitted through a portion of the transparent layer 11 neighboring the spectroscopic section 12A differs from an optical path difference h' between light transmitted through a spectroscopic section 12B and light transmitted through a portion of the transparent layer 11 neighboring the spectroscopic section 12B. For example, the refractive indices of the spectroscopic sections 12A and spectroscopic sections 12B are each greater than the refractive index of the transparent layer 11, and are different from each other. Alternatively, the spectroscopic sections 12A and spectroscopic sections 12B have mutually different lengths z12 (FIG. 2) along the z direction. More specifically, for example, the optical path difference h concerning the spectroscopic sections 12A is a half-integer multiple (0.5, 1.5, . . .) of the red light wavelength (wavelength: 700 nm), whereas the optical path difference h' concerning the spectroscopic sections 12B is a half-integer multiple (0.5, 1.5, . . .) of the blue light wavelength (wavelength: 450 nm).

As a result of this, cyan light enters the photodetection sections 15b located below the spectroscopic sections 12A, whereas red light enters the adjoining photodetection sections 15a. On the other hand, yellow light enters the photodetection sections 15b located below the spectroscopic sections 12B, whereas blue light enters the adjoin photodetection sections 15a. Therefore, the four photodetection sections surrounded by broken lines in FIG. 15 separately detect the four colors of red, cyan, blue, and yellow. A method of generating image signals of e.g. red, blue, and green out of these four colors is disclosed in Patent Document 2, for example. Thus, it is possible to obtain a full-color image by using the imaging device 102.

Similarly to the first embodiment, the interval between two adjacent spectroscopic sections 12A and 12B along a predetermined direction is smaller at the periphery than at the center of the imaging plane. Thus, as has been described in the first embodiment, the color unevenness and luminance unevenness in the peripheral portion of the captured image can be suppressed.

Note that, strictly speaking, the optimum shift amount by which the arrangement position of a spectroscopic section 12A or 12B is to be shifted from the center 15C of the photodetection section 15b differs between the spectroscopic sections 12A and the spectroscopic sections 12B. Therefore, the shift amount of a spectroscopic section 12A and the shift amount of a spectroscopic section 12B for a given incident angle may be made different. Alternatively, similarly to the first embodiment, with no distinction between the spectroscopic sections 12A and the spectroscopic sections 12B, the positions of the spectroscopic sections may be shifted based on the incident angle.

Although the present embodiment illustrates that the spectroscopic sections 12 are provided for every other one of the plurality of photodetection sections 15 that are arranged along the x direction and the y direction, spectroscopic sections 12 may instead be provided above all photodetection sections 15, and individual spectroscopic sections 12 may be designed so as to diffract light of wavelength bands other than red and blue.

Although the first and second embodiments illustrate visible light as examples of colors for separation, the spectroscopic sections may separate rays of non-visible light wavelength bands, e.g., ultraviolet or infrared.

The arrangement of the spectroscopic sections 12 in the first embodiment and the arrangement of the spectroscopic sections 12A and spectroscopic sections 12B in the second embodiment are not limited to the examples shown in the figures.

The direction of arrangement in the xy plane of the spectroscopic sections 12 in the first embodiment and the spectroscopic sections 12A and 12B in the second embodiment may be differentiated. Specifically, in the first embodiment, every spectroscopic section 12 is disposed so as to have a greater thickness along the y direction than along the x direction and be parallel to the yz plane. However, given two adjacent spectroscopic sections 12 along the x direction or the y direction, one may be disposed parallel to the xz plane and the other may be disposed parallel to the yz plane, for example. Alternatively, any other rule may be employed to differentiate the direction of arrangement of the spectroscopic sections 12.

Similarly, in the second embodiment, the direction of arrangement may differ between the spectroscopic sections 12A and the spectroscopic sections 12B, or some of the spectroscopic sections 12A may be disposed in a different direction from the others and some of the spectroscopic sections 12B may be disposed in a different direction from the others.

The direction of arrangement of the spectroscopic sections depends on which photodetection sections a separated color is to enter. On the other hand, irrespective of the direction of arrangement of the spectroscopic sections, the angle of light entering a spectroscopic section will change when going from center of the imaging plane toward the outside to indicate the aforementioned problem. Therefore, even if the direction of arrangement of some of the spectroscopic sections is made different, color unevenness, luminance unevenness, and the like can be suppressed by differentiating the interval between spectroscopic sections in the manners described above.

INDUSTRIAL APPLICABILITY

An imaging device according to one implementation of the present invention is especially useful for digital cameras, cameras for smartphones such as mobile phones, digital camcorders, and in other technological fields directed to cameras in which imaging sensors are utilized.

REFERENCE SIGNS LIST 10 imaging element
11 transparent layer
12, 12A, 12B spectroscopic section
13 zeroth order diffracted light
14 ±first order diffracted light
15a, 15b photodetection section
20 imaging plane
16 lens

The invention claimed is:
1. An imaging device comprising:
a plurality of photodetection sections having a light-receiving face, the plurality of photodetection sections being disposed in a uniform two-dimensional array of photodetection sections along a first direction and along a second direction different from the first direction, such that the light-receiving faces of the plurality of photodetection sections constitute an imaging plane;
a transparent layer having an incident face and an outgoing face and being disposed so that the outgoing face opposes the imaging plane; and
a plurality of spectroscopic sections having a greater refractive index than a refractive index of the transparent layer and being disposed in a two-dimensional array of spectroscopic sections in a plane of arrangement, the plane of arrangement being within the transparent layer and parallel to the imaging plane, wherein,
zeroth order diffracted light and ±first order diffracted light, derived from light transmitted through each spectroscopic section and a portion of the transparent layer neighboring the spectroscopic section, respectively enter distinct photodetection sections among the plurality of photodetection sections; and
an interval between two adjacent spectroscopic sections in the two-dimensional array of spectroscopic sections along a predetermined direction is smaller at a periphery than at a center of the imaging plane.
2. The imaging device of claim 1, wherein, in the transparent layer, each of the plurality of spectroscopic sections has a columnar shape or a plate-like shape longitudinal in a direction in which the incident face and the outgoing face oppose each other.

3. The imaging device of claim 2, wherein,
the plurality of spectroscopic sections are disposed in the two-dimensional array of spectroscopic sections along the first direction and along the second direction; and
each spectroscopic section has a greater thickness along the second direction than along the first direction.

4. The imaging device of claim 3, wherein an interval between two adjacent spectroscopic sections along the first direction is smaller at the periphery than at the center of the imaging plane.

5. The imaging device of claim 4, wherein an interval between two adjacent spectroscopic sections along the second direction is smaller at the periphery than at the center of the imaging plane.

6. The imaging device of claim 3, wherein an interval between two adjacent spectroscopic sections along a radial direction of a circle whose center is the center of the imaging plane is smaller at the periphery than at the center of the imaging plane.

7. The imaging device of claim 1, wherein a ray entering through the incident face and being incident at the center of the light-receiving face of each photodetection section passes closer to the photodetection section and away from a center of the spectroscopic section corresponding to the photodetection section, the center of the spectroscopic section being taken along a direction in which the incident face and the outgoing face oppose each other.

8. The imaging device of claim 1, wherein the plurality of spectroscopic sections include a plurality of first type of spectroscopic sections and a plurality of second type of spectroscopic sections, the plurality of first type of spectroscopic sections and the plurality of second type of spectroscopic sections diffracting light of mutually different wavelength bands.

9. The imaging device of claim 1, wherein an interval between two adjacent spectroscopic sections along the first direction is smaller at a periphery than at a center of the imaging plane, and an interval between two adjacent spectroscopic sections along the second direction remains uniform.

* * * * *